United States Patent
Olea et al.

(10) Patent No.: US 12,557,226 B2
(45) Date of Patent: Feb. 17, 2026

(54) MODULAR KIOSK SYSTEM

(71) Applicant: Olea Kiosks Inc., Cerritos, CA (US)

(72) Inventors: Francisco Olea, Cerritos, CA (US); Chester Rosales, Ladera Ranch, CA (US); Brian Gonzalez Granados, Palmdale, CA (US); Jorge Alfonso Bautista Hernandez, Cerritos, CA (US)

(73) Assignee: Olea Kiosks, Inc., Cerritos, CA (US)

( * ) Notice: Subject to any disclaimer, the term of this patent is extended or adjusted under 35 U.S.C. 154(b) by 476 days.

(21) Appl. No.: 18/193,630

(22) Filed: Mar. 31, 2023

(65) Prior Publication Data

US 2024/0334630 A1 Oct. 3, 2024

(51) Int. Cl.
*H05K 5/02* (2006.01)
*F16M 11/04* (2006.01)
*F16M 11/42* (2006.01)

(52) U.S. Cl.
CPC ......... *H05K 5/0234* (2013.01); *F16M 11/045* (2013.01); *F16M 11/046* (2013.01); *F16M 11/42* (2013.01)

(58) Field of Classification Search
CPC .. H05K 5/0234; F16M 11/045; F16M 11/046; F16M 11/42
See application file for complete search history.

(56) References Cited

U.S. PATENT DOCUMENTS

| | | |
|---|---|---|
| 7,374,258 B2 | 5/2008 | Bowron |
| 7,559,520 B2 | 7/2009 | Quijano |
| 8,365,868 B2 | 2/2013 | Johnson |
| 9,256,720 B2 | 2/2016 | Berini |
| 11,174,983 B1 * | 11/2021 | Su .............................. A47F 5/04 |
| 2009/0289104 A1 * | 11/2009 | Yoneda ..................... G06F 1/16 235/375 |
| 2013/0092805 A1 * | 4/2013 | Funk ...................... F16M 13/00 248/274.1 |
| 2014/0316562 A1 * | 10/2014 | Leitmann ................ G07F 11/54 221/210 |
| 2019/0096174 A1 * | 3/2019 | Ambrecht ........... G07F 17/3223 |
| 2020/0315376 A1 * | 10/2020 | Engler .................... G06F 1/181 |
| 2021/0007515 A1 | 1/2021 | Tipp |
| 2021/0134109 A1 | 5/2021 | Hemerick |

FOREIGN PATENT DOCUMENTS

| | | |
|---|---|---|
| EP | 1102222 A2 | 5/2001 |
| KR | 20110138520 A | 12/2011 |

OTHER PUBLICATIONS https://www.grievecorp.com/product/drawer-perforated-dwrdr3exp/.
https://cashcityatm.com/product-kiosk-atm-monimax-5300.php.
https://www.dieboldnixdorf.com/en-us/banking/portfolio/dn-series/atm-sidecars/.
https://www.aviationpros.com/airports/airport-technology/pressrelease/21270155/visionbox-unveils-seamless-kiosk-the-new-generation-of-biometrictechnology-set-to-transform-the-travel-experience.

* cited by examiner

Primary Examiner — Allen L Parker
Assistant Examiner — Keon Kim
(74) Attorney, Agent, or Firm — Kevin Schraven; Anooj Patel; Hankin Patent Law, APC

(57) ABSTRACT

A modular kiosk system, comprising a core structure, a modular mount, a drawer, a monitor, and one or more sidecars that are configured to engage with a peripheral or other electronic device. The modular mount has one or more enclosure arms that are configured to engage with the sidecars. The various sidecars are interchangeable, such that the kiosk may be modularly rearranged and set up with the desired peripherals with a minimum of effort.

1 Claim, 15 Drawing Sheets

MODULAR KIOSK SYSTEM

FIELD OF THE DISCLOSURE

The present disclosure relates to modular kiosks. More specifically, the present disclosure relates to a modular kiosk system whose features comprise universally adjustable front drawer profiles, a core structure, a modular display/monitor mount with universally adjustable sidecar enclosure arms, interchangeable sidecar enclosures, shoulder sidecars, and internal component management. Utilizing a highly modular kiosk system allows for numerous kiosk configurations while improving kiosk manufacturing efficiency.

BACKGROUND

Self-service kiosks have increasingly become part of everyday life. Kiosks are found in a large array of industries including: retail, gaming, e-government, hospitality, education, food service, human resources, and ticketing. Because kiosks perform a wide variety of functions, they are often equipped with multiple types of devices such as payment devices, printers, card readers, biometric devices, keypads, touch screen monitors, and other types of input-output devices. When choosing a kiosk, proprietors often desire to be able to choose from several variations or configurations. Manufacturers of kiosks must be able to meet these variable requests but also be able to produce kiosks in a cost-efficient manner without creating expensive custom-made kiosks.

Some kiosks have disclosed modifiable and interchangeable components, however, those kiosks do not offer all of the positional variations that often are needed by customers. For example, other kiosks are known to limit the location for interchangeable components to the front panel of a kiosk. While a customer might change the components of the front panel, those kiosks typically are limited to the same structural position on the front panel of the kiosk. That type of kiosk variation offers little design customization. Other kiosks are also known to require significant modification to the core structures to support variation in the operational components. These kiosks have limited configuration options for customers, and limited modification options for the structural design, thus providing production challenges for the kiosk manufacturers.

Thus, what is needed is a modular kiosk system that enables kiosk manufacturers to produce a wide variety of kiosk designs without significant manufacturing challenges or variations to the core structure or design components, but rather to enable universally adjustable peripherals.

SUMMARY

The following presents a simplified overview to provide a basic understanding of some of the example embodiments. This simplified overview is not intended to identify critical elements of the example embodiments nor to delineate the entire scope of the claimed inventions. Its sole purpose is to present some simplified concepts of the example embodiments as a prelude to the more detailed descriptions that are presented hereinbelow. It is to be understood that both the following general description and the following detailed description are exemplary and explanatory only and are not intended to be restrictive.

One embodiment may be a modular kiosk system comprising a core structure, a modular mount, a drawer, and a monitor, wherein the monitor may be attached to a modular mount which may preferably be attached to the core structure. The drawers may preferably be attached to the core structure below the modular mount. The core structure may be configured with an angular recess, and the drawer may be attached to the angular recess by drawer arms. In some embodiments the drawer may comprise one or more drawer profiles. The drawer profile may be vertical in some embodiments and angular in others, wherein the vertical and angular drawer profiles utilize the same drawer arms, such that the vertical drawer profiles and angular drawer profiles may be interchangeable. In some embodiments, the drawer profiles may have peripheral panels, wherein the peripheral panels may preferably be configured to adapt to various kiosk devices. In some embodiments, the different variations of the vertical drawer profile peripheral panels may be interchangeable with one another, and the different peripheral panels for the angular drawer profiles may also be interchangeable with one another.

In another embodiment, the drawer may have a perforated bottom. In other variations, the modular kiosk system may comprise a modular mount which may comprise a base plate with a raised perimeter that wraps around the edges of the base plate and forms slots that may preferably engage with enclosures arms, and the base plate may preferably have holes for mounting a monitor, wherein a cover plate may mount with the base plate, substantially enclosing the modular mount. In some embodiments, a blank may be included to be used on slots without enclosure arms, wherein enclosure arms might be attached to one or more sidecar enclosures, which may preferably extend to the perimeter of the monitor. The enclosures may or may not include channels for cable and wire management. In some variations, the enclosure arms may come in various sizes, and the enclosure arms may be interchangeable with one another in any of the slots on the base plate. In other embodiments, the sidecar enclosures may be configured to be attached to various kiosk devices.

In other embodiments the core structure of the modular kiosk system may have cutouts designed for shoulder sidecars, wherein the shoulder sidecars may preferably be attached to the core structure at these cutouts. The shoulder cutouts may preferably be configured to attach to a variety of kiosk devices. In most variations, the shoulder sidecars may be interchangeable with one another. In other embodiments, the core structure may include audio perforations, or may include a hinged back cover. Some variations of the modular kiosk system may include one or more cabinets, wherein the cabinets may preferably consist of peripheral panels, which may be configured to support various kiosk devices. The peripheral panels may be interchangeable such that the same cabinet can accommodate multiple variations of peripheral panels. In some modular kiosk systems, the cabinets may have doors, which may or not be lockable.

In some embodiments, the modular kiosk system with one or more cabinets may be attached to a riser, and in other variations the cabinets may be attached to a static base plate. In another variation, the modular kiosk system may rest on wheels. And in another variation, the modular kiosk system with a riser may be attached to a base with wheels. In other embodiments, one or more internal modular management plates may be housed in either the core structure, the drawer, or in one or more cabinets.

Preferably, the modular kiosks and kiosk system may have: adjustable sidecar arm extensions; different lengths; easily adjusts to different display sizes; securely attaches to existing mounting holes on standard displays; provides peripherals on all sides of the display; works in both portrait and landscape orientation; adapts to both proprietary and third party sidecar brackets.

Preferably, the kiosks and kiosk systems of the present disclosure may be configured to be countertop or freestanding and may have modular front panels and drawer profiles, including, but not limited to: two adaptable drawer options for specific use cases: (i) angled—for ergonomic scanning and biometric use cases; and (ii) vertical—which provides an ideal surface for printers; a door that easily pulls out on slides for easy access; a perforated drawer bottom that provides countless connection points; front plates that are modular and can be quickly changed out; front plates that can easily be re-engineered or re-configured for new components, as opposed to needing to re-engineer the entire door; vertical front plates that are designed or configured to work interchangeably on other locations of the kiosk, such as on the double wide and lower cabinet face.

Preferably, the kiosks and kiosk system of the present disclosure may have a modular base that preferably has one or more of the following: peripheral panels that may be interchangeable between upper and lower; a front door that hinges open; peripherals within the pullout on drawer slides; a riser added to the base plate to raise scanners to an ergonomic height; and/or a wheeled base for mobility, optionally with included battery storage.

Preferably the kiosks and kiosk system of the present disclosure may have internal modular management features, including, but not limited to: modular interior management that quickly adapts to the selected peripheral components; ease of assembly and integration; faster speed to market; and/or lower labor and part costs.

Preferably the kiosks and kiosk system of the present disclosure may have sidecar enclosures that feature one or more of: modular enclosures that can work on all sides of the display; and/or a front panel that can be changed to work with different components, such as: EMV, RFID, 2d scanners, cameras, signage, lighting, and the like. EMV stands for Europay®, MasterCard® and Visa® and refers to the increased security of payment card transactions through the use of a chip embedded in credit, debit, and prepaid cards.

Still other advantages, embodiments, and features of the subject disclosure will become readily apparent to those of ordinary skill in the art from the following description wherein there is shown and described a preferred embodiment of the present disclosure, simply by way of illustration of one of the best modes best suited to carry out the subject disclosure. As will be realized, the present disclosure is capable of other different embodiments and its several details are capable of modifications in various nonobvious embodiments all without departing from, or limiting, the scope herein. Accordingly, the drawings and descriptions should be regarded as illustrative in nature and not as restrictive.

BRIEF DESCRIPTION OF THE DRAWINGS

The drawings are of illustrative embodiments. They do not illustrate all embodiments. Other embodiments may be used in addition or instead of what is shown. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF THE ILLUSTRATIVE EMBODIMENTS

Figure 1:
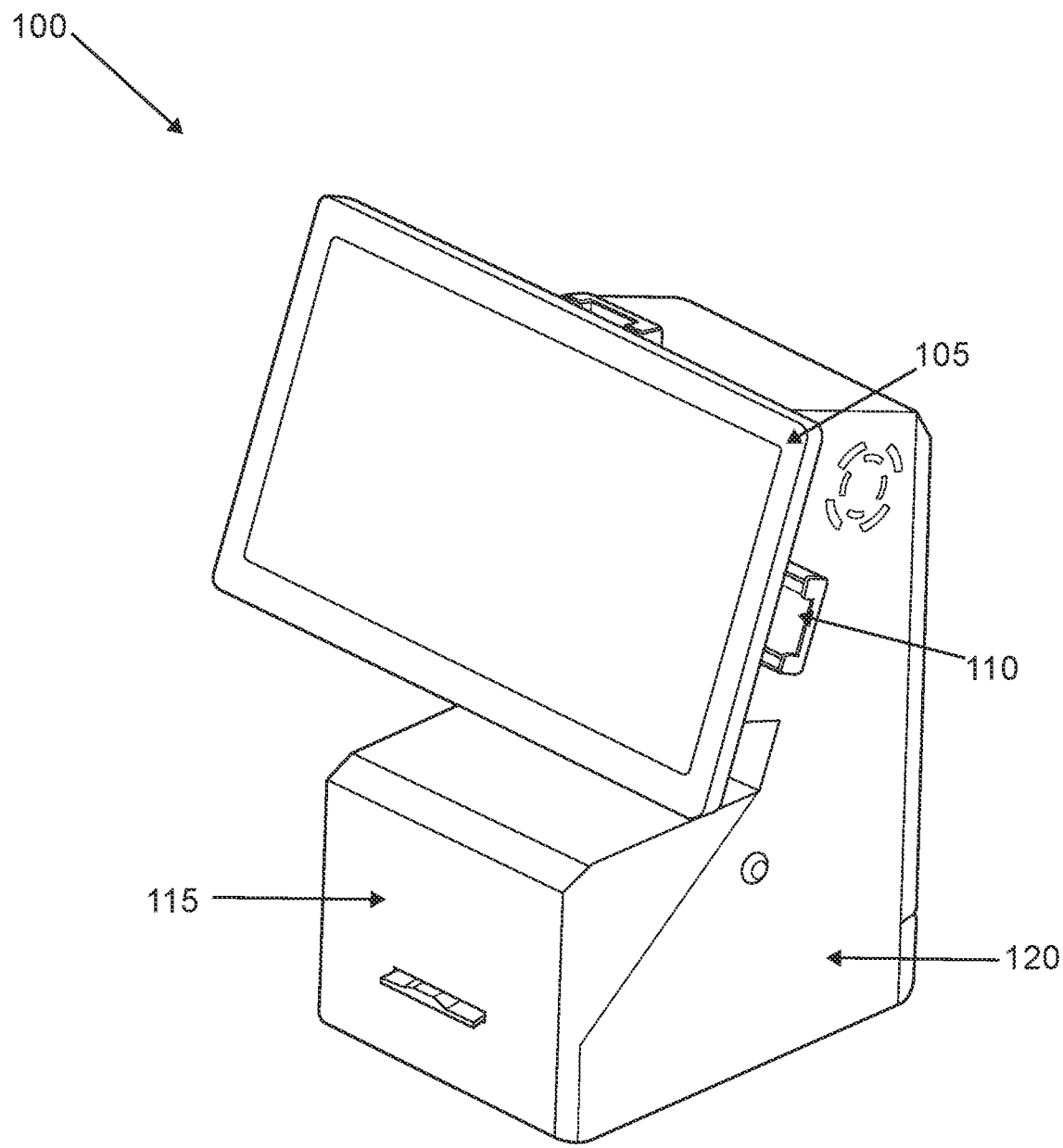
FIG. 1 is an illustration of a front perspective view of one embodiment of a kiosk with a monitor in the landscape orientation.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural references unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances when said event or circumstance occurs and instances when it does not.

Throughout the description and claims of this specification, the word "comprise" and variations of the word, such as "comprising" and "comprises," means "including but not limited to," and is not intended to exclude, for example, other components, integers, or steps. "Exemplary" means "an example of" and is not intended to convey an indication of a preferred or ideal embodiment. "Such as" is not used in a restrictive sense, but for explanatory purposes.

Disclosed are components that may be used to perform the disclosed methods and systems. These and other components are disclosed herein, and it is understood that when combinations, subsets, interactions, groups, etc., of these components are disclosed that, while specific reference to each various individual and collective combination and permutation of these may not be explicitly disclosed, each is specifically contemplated and described herein, for all methods and systems. This applies to all embodiments of this application including, but not limited to, steps in disclosed methods. Thus, if there are a variety of additional steps that may be performed, it is understood that each of these additional steps may be performed with any specific embodiment or combination of embodiments of the disclosed methods.

The present methods and systems may be understood more readily by reference to the following detailed description of preferred embodiments and the examples included therein and to the Figures and their previous and following description.

In the following description, certain terminology is used to describe certain features of one or more embodiments. For purposes of the specification, unless otherwise specified, the term "substantially" refers to the complete or nearly complete extent or degree of an action, characteristic, property, state, structure, item, or result. For example, in one embodiment, an object that is "substantially" located within a housing would mean that the object is either completely within a housing or nearly completely within a housing. The exact allowable degree of deviation from absolute completeness may in some cases depend on the specific context. However, generally speaking, the nearness of completion will be so as to have the same overall result as if absolute and total completion were obtained. The use of "substantially" is also equally applicable when used in a negative connotation to refer to the complete or near complete lack of an action, characteristic, property, state, structure, item, or result.

As used herein, the terms "approximately" and "about" generally refer to a deviance of within 5% of the indicated number or range of numbers. In one embodiment, the term "approximately" and "about", may refer to a deviance of between 0.001-40% from the indicated number or range of numbers.

For purposes of this disclosure, the term "monitor" or "display" refers to any visually interactive output device, and may preferably be a computer or electronic monitor or display, including but not limited to: active displays that emit light; passive displays that modulate light; television screens; touch screens; electroluminescent (EL); liquid crystal (LC); light-emitting diode (LED); combination LED and LC; organic LED (OLED); active matrix OLED (AMO-LED); plasma; cathode ray tubes; field emission displays; vacuum fluorescent displays; surface conduction electron-emitter displays; numitron; flap; flip-disk; digital micromirror device; interferometric modulator display; and combinations thereof.

Various embodiments are now described with reference to the drawings. In the following description, for purposes of explanation, numerous specific details are set forth in order to provide a more thorough understanding of one or more of the embodiments. It may be evident, however, that the various embodiments may be practiced without some or all of these specific details. In other instances, well-known structures and devices are shown in block diagram form to facilitate describing these embodiments.

FIG. 1 is an illustration of a front perspective view of one embodiment of a kiosk with a monitor in the landscape orientation. As shown, kiosk 100 may comprise a modular mount 110 for a monitor 105, a drawer 115, and a core structure 120. The monitor 105, which may or may not be a part of the claimed kiosk, may preferably be attached to a modular mount 110 that may be attached to the core structure 120. The core structure 120 may preferably be configured to serve as the central structure of the kiosk 100. The modifiable elements of the kiosk may generally be attached to the core structure 120 in a modular manner so that multiple embodiments of kiosks may be generated without significant modifications to the core structure 120. FIG. 1 shows that the core structure 120 may be made from several housing panels that substantially enclose and protect an internal cavity. The internal cavity of the core structure may protect and house the necessary electronic and power supply components of the kiosk 100. As shown in FIG. 1, the core structure 120 is configured to be placed on a stand, countertop, or pedestal for ease of use by the consumer. When used without a base, the kiosk 100 is much easier to lift and transport.

Figure 2:
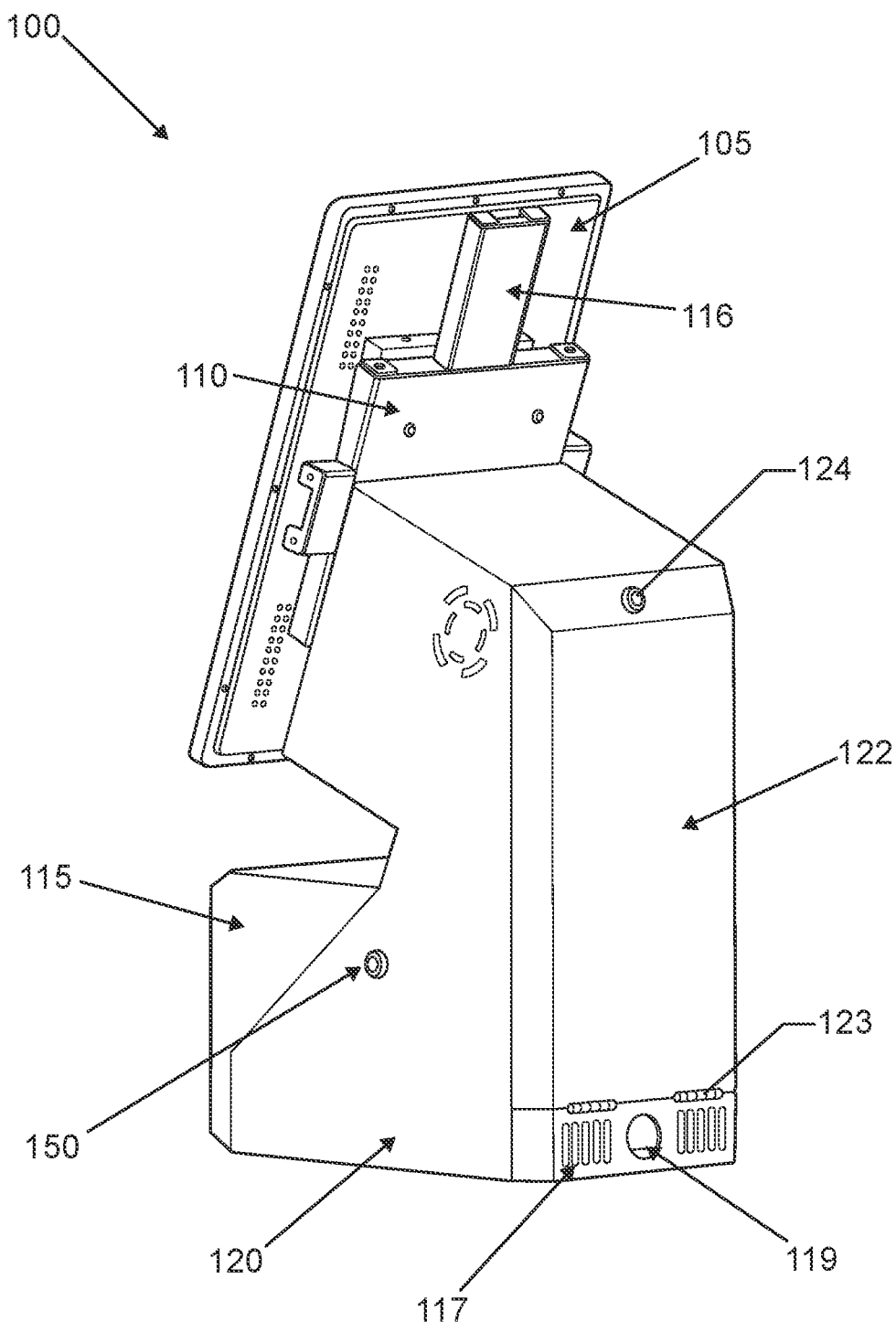
FIG. 2 is an illustration of a rear perspective view of one embodiment of a kiosk with a monitor in the portrait orientation.

FIG. 2 is an illustration of a rear perspective view of one embodiment of a kiosk with a monitor in the portrait orientation. As shown in FIG. 2, kiosk 100 may preferably comprise monitor 105, modular mount 110, drawer 115, and core structure 120. The monitor 105 may be removably attached to a modular mount 110, which may be removably attached to the core structure 120. The monitor 105 may be configured to be mounted in the landscape orientation, as shown in FIG. 1, or in the portrait orientation, as shown in FIG. 2. The modular mount 110 and the enclosure arms 116, of which there are preferably four (top, bottom, left, and right), may preferably allow for the monitor 105 to have multiple configurations. As shown, the core structure 120 may comprise a hinged back panel 122 for access to interior components of kiosk 100. The user may unlatch or unscrew the panel at connector 124 and then hinge down the back panel 122 via hinge 123. Various vent holes 117 may be included for heat dissipation or allowing speaker sounds to be heard better.

Cable holes 119 may be included to allow for connection and power cord management. FIG. 2 shows one embodiment of a shoulder sidecar mounting fastener 150 on the core structure 120.

Figure 3:
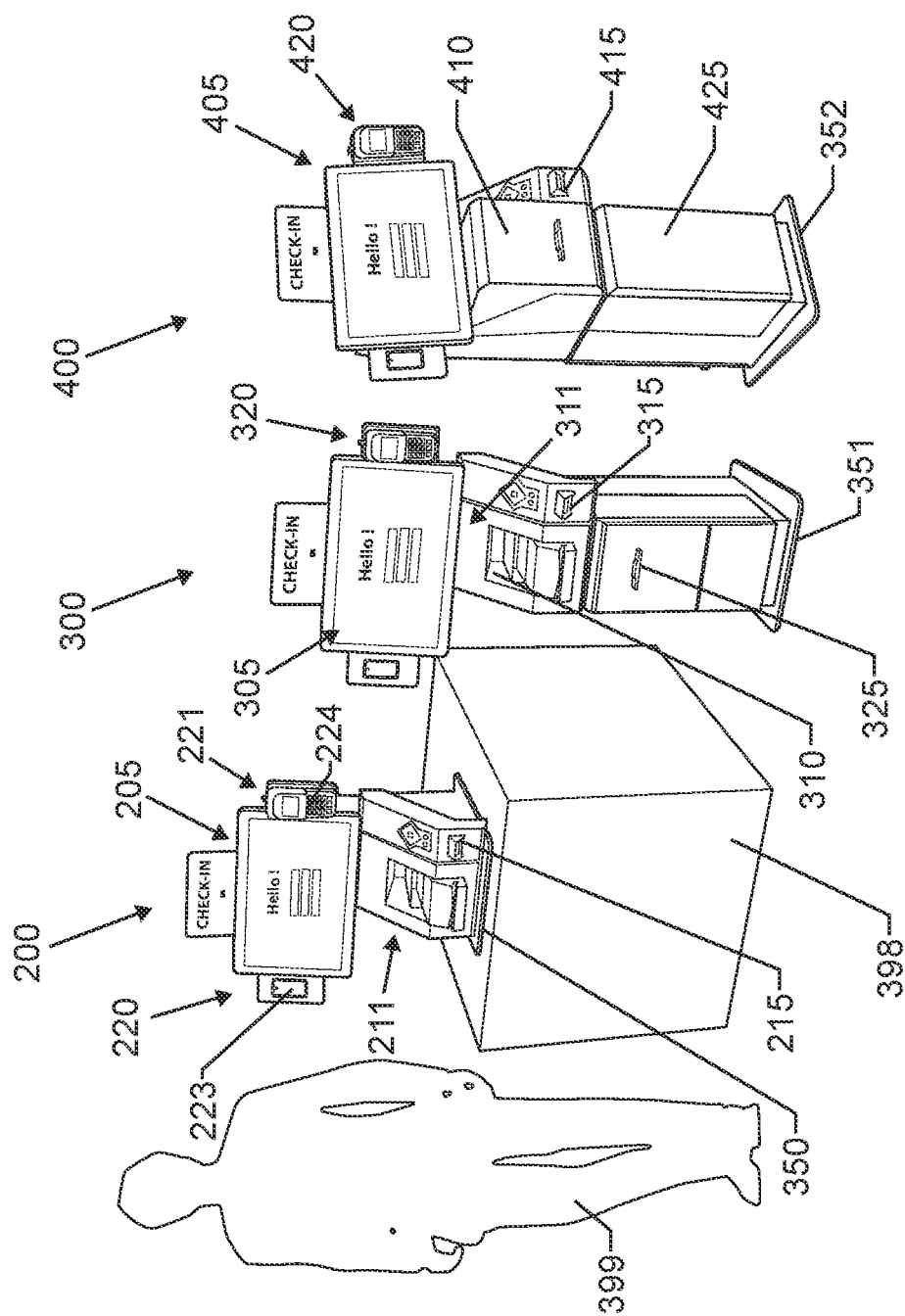
FIG. 3 is an illustration of perspective views of three embodiments of the kiosk.

FIG. 3 is an illustration of perspective views of three embodiments of the kiosk. As shown in FIG. 3, the kiosk system may be modular such that the same kiosk can easily be configured to perform different functions and have different features. FIG. 3 shows kiosks 200, 300, and 400 next to a silhouette 399 of an adult human to show a preferred approximate size of the kiosks and kiosk system of the present disclosure. Each of the kiosks 200, 300, and 400 is shown with a sign, which is preferably removably attachable to the respective monitor or modular mount and informs users what the primary function is of each specific kiosk.

As shown, kiosk 200, configured modularly to sit on a countertop, may comprise a monitor 205, an angular drawer profile 210, a core structure 211, a shoulder sidecar 215, one or more sidecar enclosures 220, 221, and a base plate 350. The base plate 350 may removably connect to the core structure 211, so that the kiosk 200 can be securely, but removably mounted to the countertop 398. The angular drawer profile 210 preferably allows for an ergonomic user interface and may comprise one or more peripheral devices to be integrated, such as a biometric device or a scanner. FIG. 3 shows that the monitor 205 may be a touch screen monitor that acts as the primary user interface of the kiosk 200.

Although only two sidecar enclosures 220, 221 are shown, it is possible to attach up to four sidecar enclosures, one to each side of the core structure 211, or even more than four, in some embodiments. The sidecar enclosures 220, 221 are preferably removably connected to the modular mount and/or the monitor 205. As shown in FIG. 2, the sidecar enclosures 220, 221 may each have a different peripheral device 223, 224 attached. The peripheral devices may be scanners, input devices, biometric devices, payment devices, output devices, printers, data collection devices, information providing devices, cameras, sensors, connectivity devices, combinations thereof, and the like.

The shoulder sidecar 215 may be removably connected to the core structure 211. Although only one shoulder sidecar is shown connected to core structure 211, a second shoulder sidecar may be removably connected to the other side of the core structure 211. In one embodiment, the shoulder sidecar 215 may be on the left side of the core structure 211. The shoulder sidecars may be scanners, input devices, biometric devices, payment devices, output devices, printers, data collection devices, information providing devices, cameras, sensors, connectivity devices, combinations thereof, and the like.

Kiosk 300 is shown with monitor 305, an angular drawer profile 310, one or more shoulder sidecars 315, one or more sidecar enclosures 320, base plate 351, and one or more cabinets 325.

As shown, the cabinets 325 may be securely, but preferably removably, attached to the core structure 311, such that the user interface components of the kiosk 300 are more easily accessible to a user. The base plate 351 may be securely, but preferably removably, attached to the cabinets 325 and/or the ground.

In another embodiment, the kiosk 400 may include a monitor 405, a vertical drawer profile 410, one or more shoulder sidecars 415, one or more sidecar enclosures 420, and one or more cabinets 425. The vertical drawer profile 410 may be used to house large output peripherals, such as printers.

Figure 4:
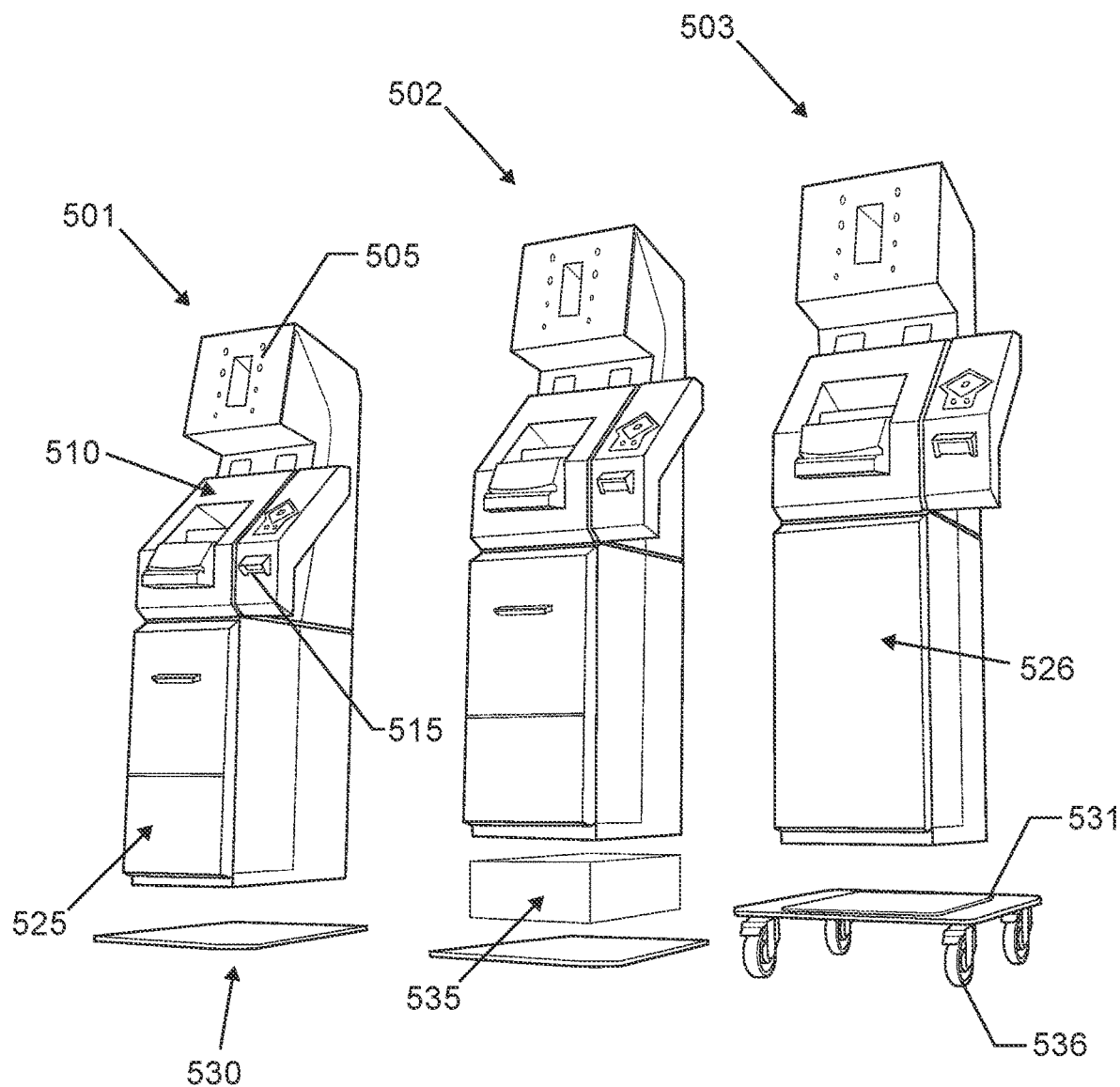
FIG. 4 is an illustration of perspective and partially exploded views of three additional embodiments of the kiosk with various bases.

FIG. 4 is an illustration of a perspective and partially exploded view of three additional embodiments of the kiosk with various bases. FIG. 4 shows kiosks 501, 502, and 503, with various bases. In one embodiment, kiosk 501 may comprise core structure 505, an angular drawer profile 510, one or more shoulder cars 515, one or more cabinets 525, and a base plate 530. In another embodiment, kiosk 502 is the same kiosk as kiosk 501, but with the addition of a riser 535, which allows the height of the kiosk 502 to be raised as desired. In another embodiment, kiosk 503 may be the same as kiosk 501, but may have a different cabinet 526 and the base plate 531 may comprise one or more wheels 536. The wheels 536 may preferably be any type of wheel or castor, including, but not limited to: lockable castor type wheels; tires; hard wheels; inflatable wheels; spoke wheels; swivel castors; or any lockable or non-lockable wheel/castor. The wheels 536 may be used when theft is not generally an issue and/or when ease of moving the kiosk 503 is desired.

Figure 5:
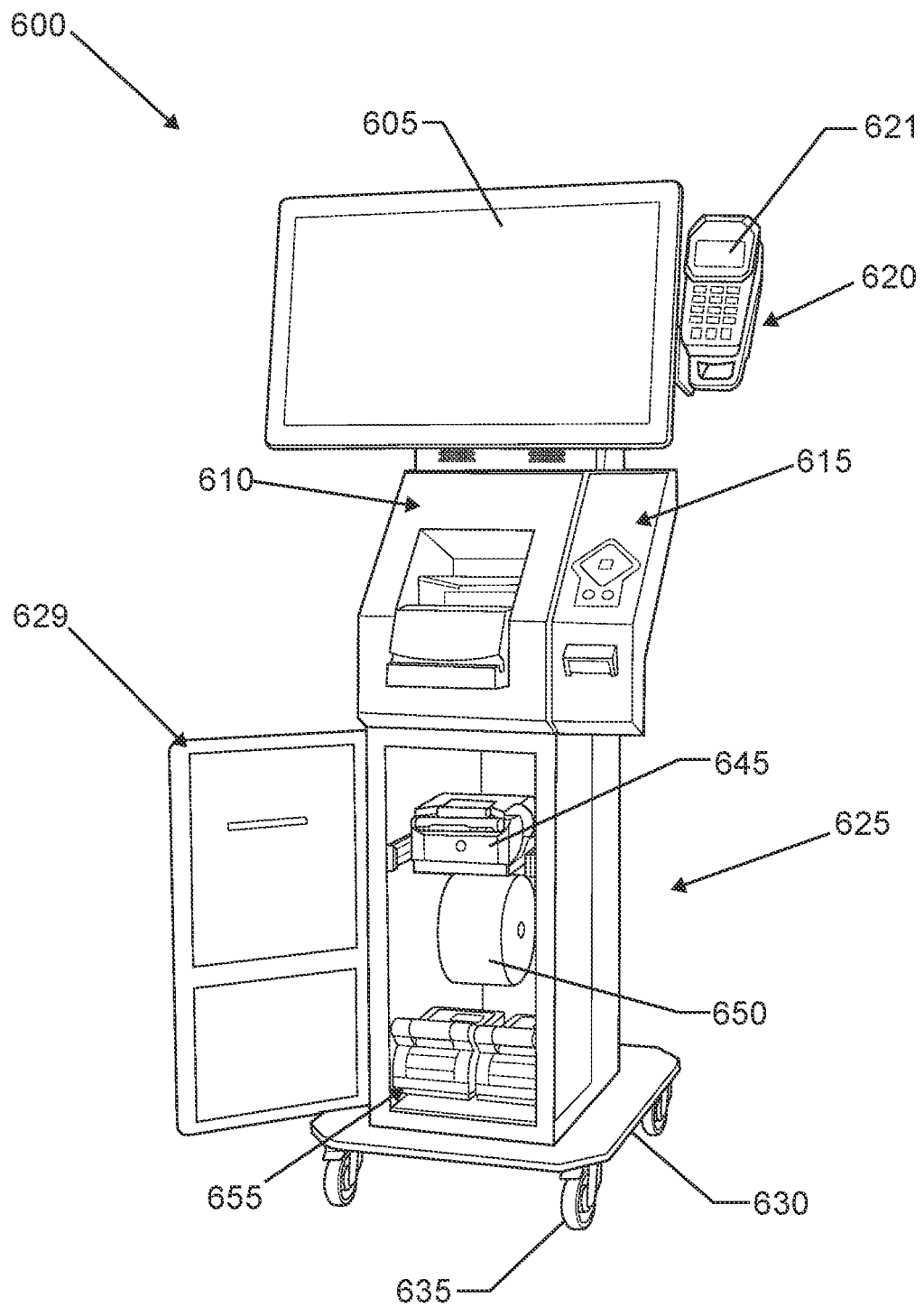
FIG. 5 is an illustration of one embodiment of a kiosk with a cabinet and a door.

FIG. 5 is an illustration of one embodiment of a kiosk with a cabinet and a door. FIG. 5 shows that kiosk 600 may comprise a monitor 605, an angular drawer profile 610, one or more shoulder sidecars 615, one or more sidecar enclosures 620, to which peripheral 621 is mounted, a cabinet 625, a base plate 630, and wheels 635. As shown, the cabinet 625 may comprise a door 629 that may be lockable for security purposes. The internal cavity of the cabinet 625 may preferably be configured to contain components that are necessary or helpful for correct functioning of kiosk 600. Such components may include, but are not limited to, printers 645, printer paper 650, and batteries 655. In embodiments utilizing wheels 635 and batteries 655, the kiosk 600 may be easily transported and capable of performing all required functions without wired power, communication cables, or other external connections. This makes the kiosk extremely moveable and the kiosk can much more easily be placed where consumer demand is highest, such as being able to be transported to various airport terminals for passport scanning or ticketing.

Figure 6:
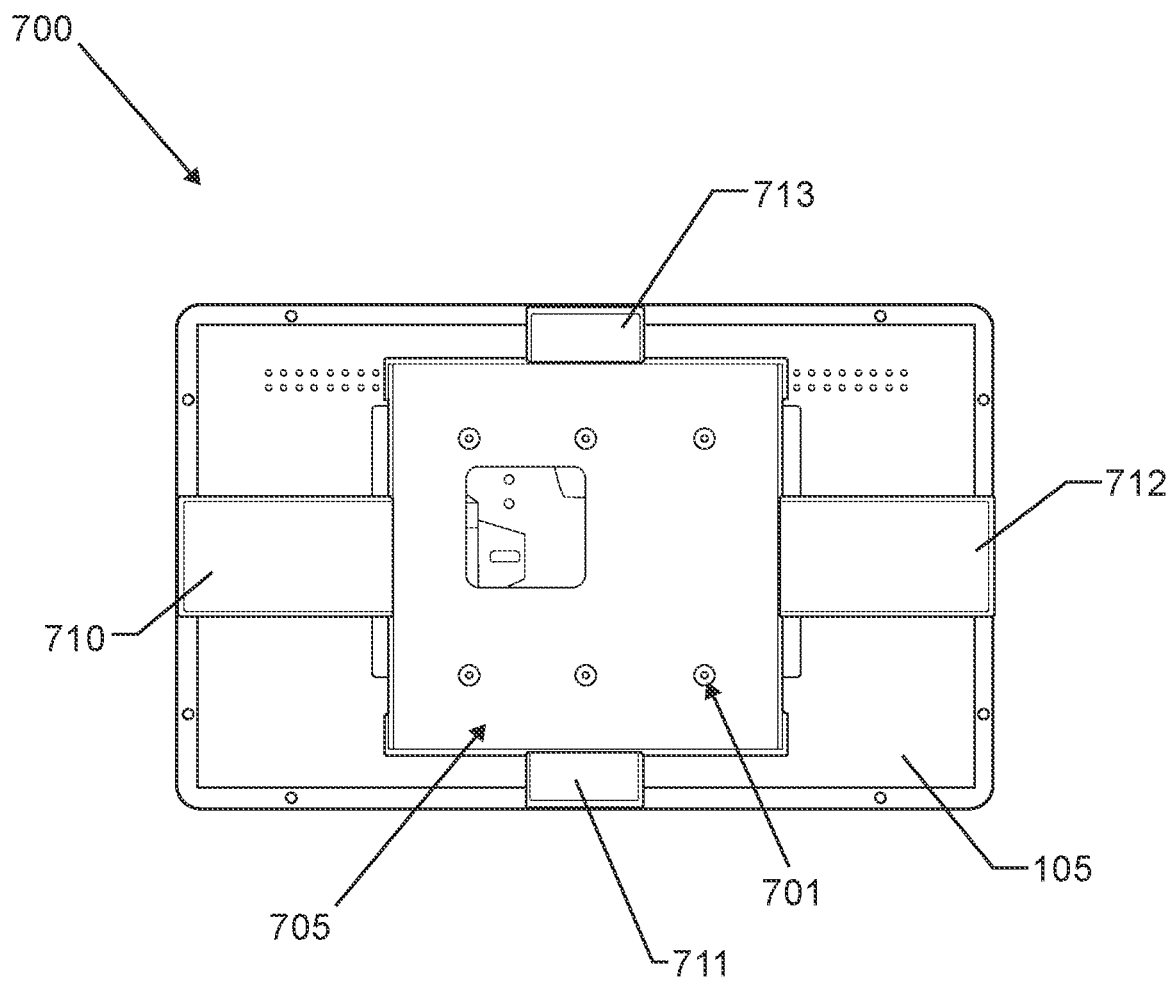
FIG. 6 is an illustration of a perspective view of one embodiment of a modular mount attached to the back of a monitor.

FIG. 6 is an illustration of a perspective view of one embodiment of a modular mount attached to the back of a monitor. FIG. 6 shows modular mount 700 attached to the back of a monitor 105. The modular mount 700 may comprise a cover plate 705, which may preferably be removeable via fasteners 701, which are typically threaded screws, and four enclosure arms 710, 711, 712, 713. The modular mount 700 may attach to a monitor 105 when the monitor 105 is in either the portrait or landscape orientation. The modular mount 700 may preferably utilize Video Electronics Standards Association (VESA) hole/connection point patterns (not shown), which are typically in a square, rectangular, or X pattern, to conform to industry standards for the mounting of flatscreen displays, televisions, and monitors. VESA hole patterns may be the preferred mounting configuration, but other hole mounting patterns may be used as well. The modular mount 700 may be attached to a monitor 105 with bolts or screws commonly used for monitor and flatscreen display mounting.

Figure 7:
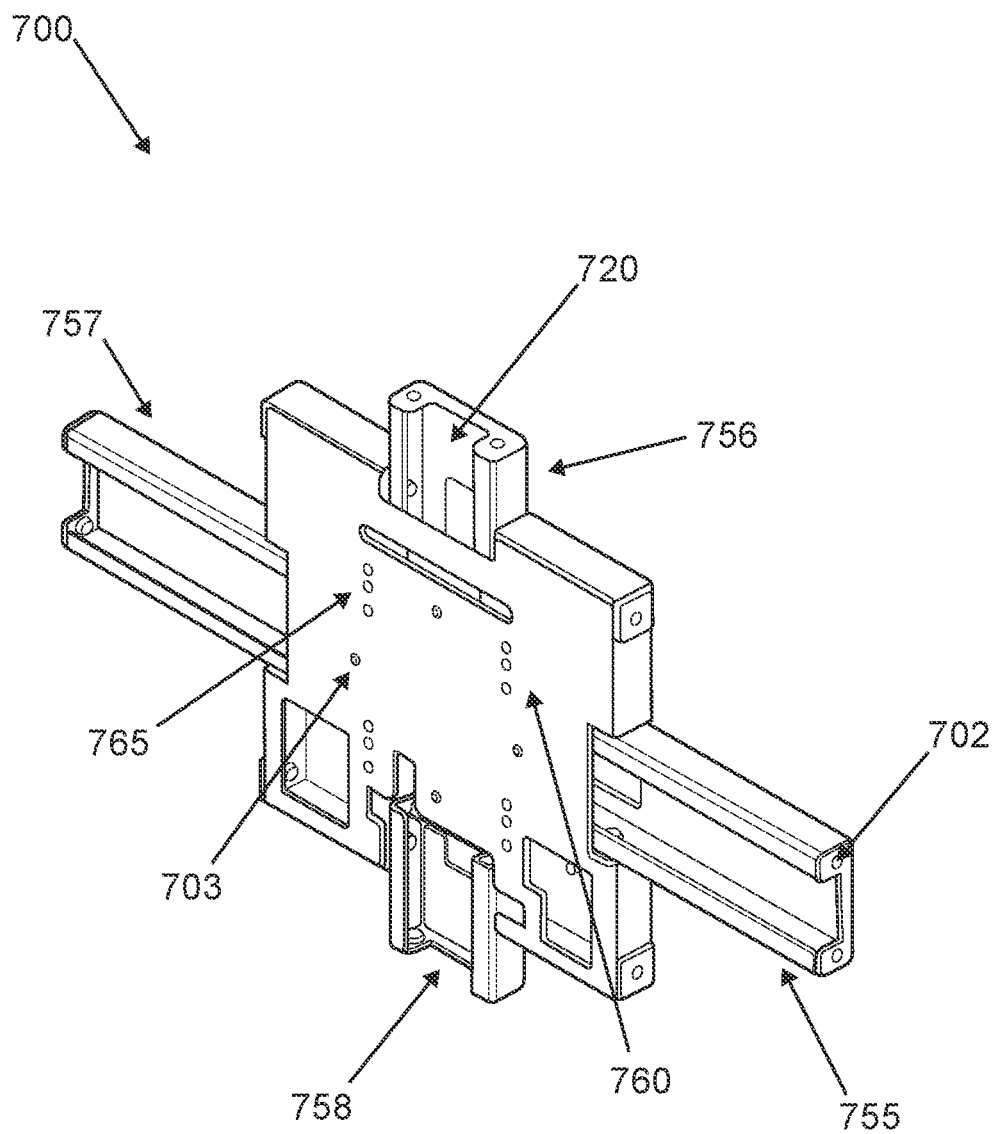
FIG. 7 is an illustration of a perspective view of one embodiment of a modular mount showing the monitor adjacent side.

FIG. 7 is an illustration of a perspective view of one embodiment of a modular mount showing the monitor adjacent side. As shown, modular mount 700 may comprise enclosure arms 755, 756, 757, 758, back cover plate 760, four sets of monitor mounting holes 765, sidecar enclosure mounting holes 702, and enclosure arms adjustments 703. Preferably, each of the enclosure arms 755, 756, 757, 758 may include a channel 720 for cable management, power cord passage, and electrical connections management between, on the one hand, the monitor and any peripherals connected to the sidecar enclosures, and, on the other hand, the core structure. Preferably, the enclosure arms 755, 756, 757, 758 may attach to various sidecar enclosures using the sidecar enclosure mounting holes 702. The removeable connection between the enclosure arms 755, 756, 757, 758 and the sidecar enclosures may comprise any type of connector, such as pin and hole, bolt and nut, screw, fastener, claps, friction snaps, and the like. Enclosure arms 755, 756, 757, 758 may preferably be available in several sizes and lengths to accommodate various monitor sizes and installation orientations. Typically, the enclosure arms 755, 756, 757, 758 sizes may be approximately 22-27 inches, but other sizes may be used. The enclosure arms 755, 756, 757, 758 may be sized or installed in such a manner as to extend sidecar enclosures along the edges of the monitor or beyond. Enclosure arms 755, 756, 757, 758 may preferably be configured so that they are compatible with third-party sidecar brackets and allow for adaptability to non-conventional component fastening systems. As shown in FIG. 7, the enclosure arms 755, 756, 757, 758 may telescope in and out of the main body of the modular mount 700, such that they may be used with a range of monitor sizes without needing to be replaced or swapped out. Once in place (extended or retracted), the enclosure arms 755, 756, 757, 758 may be locked into place via enclosure arms adjustments 703, which may be a locking pin and hole, release tab, screw and slot, or the like.

Figure 8:
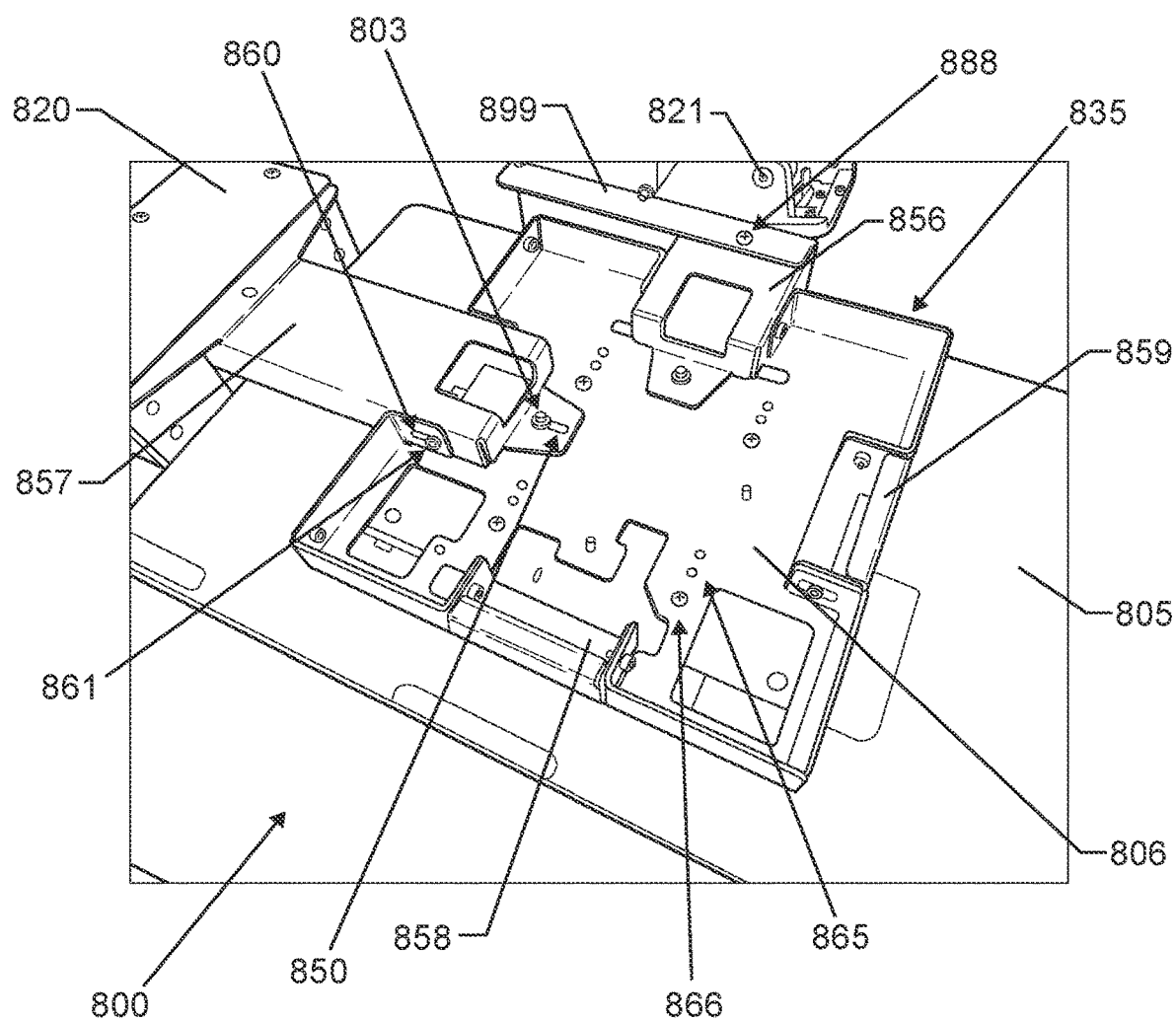
FIG. 8 is an illustration of the enclosure arms attached to one embodiment of a modular mount.

FIG. 8 is an illustration of the enclosure arms attached to one embodiment of a modular mount. As shown in FIG. 8, the cover plate has been removed from the modular mount 800 so that the interior of the modular mount 800 and the interior face of the back cover plate 806 are visible. As shown in FIG. 8, the modular mount 800 may comprise enclosure arms 856, 857, 858, 859. As shown, enclosure arms 856, 857 are extended beyond the rim 835 of the modular mount 800 and are configured to engage with sidecar enclosures 820, 899, which are approximately at the edges of monitor 805. Enclosure arms 858, 859 are blanks, which may preferably be flush with the rim 835 and are not configured to engage with any sidecar enclosures. As shown, the enclosure arms 858, 859 may be connected to the back cover plate 806 at adjustable connectors 803, 850, 860, 861. The adjustable connectors 850, 860 may be slots on the enclosure arms 858, 859. Adjustable connectors 803, 861 may be screws that pass through adjustable connectors 850, 860 and releasably connect the enclosure arms 858, 859 to the back cover plate 806. The enclosure arms may preferably be able to fit a variety of monitor sizes by adjusting how far the enclosure arms stick out from the rim 835. Once the enclosure arms 858, 859 are set in place, the adjustable connectors 803, 850, 860, 861 may be engaged to secure the enclosure arms 858, 859 to the back cover plate 806.

FIG. 8 also shows the sets of monitor mounting holes 865, which may be arrayed in a rectangle on the back cover plate 806 and are configured to align in a standard way with the mounting holes that are standard in most monitors.

Sidecar enclosure 899 may be connected to the enclosure arm 856 via a variety of connectors, including screw 888. As shown, peripheral 821 may be engaged by sidecar enclosure 899.

Figure 9:
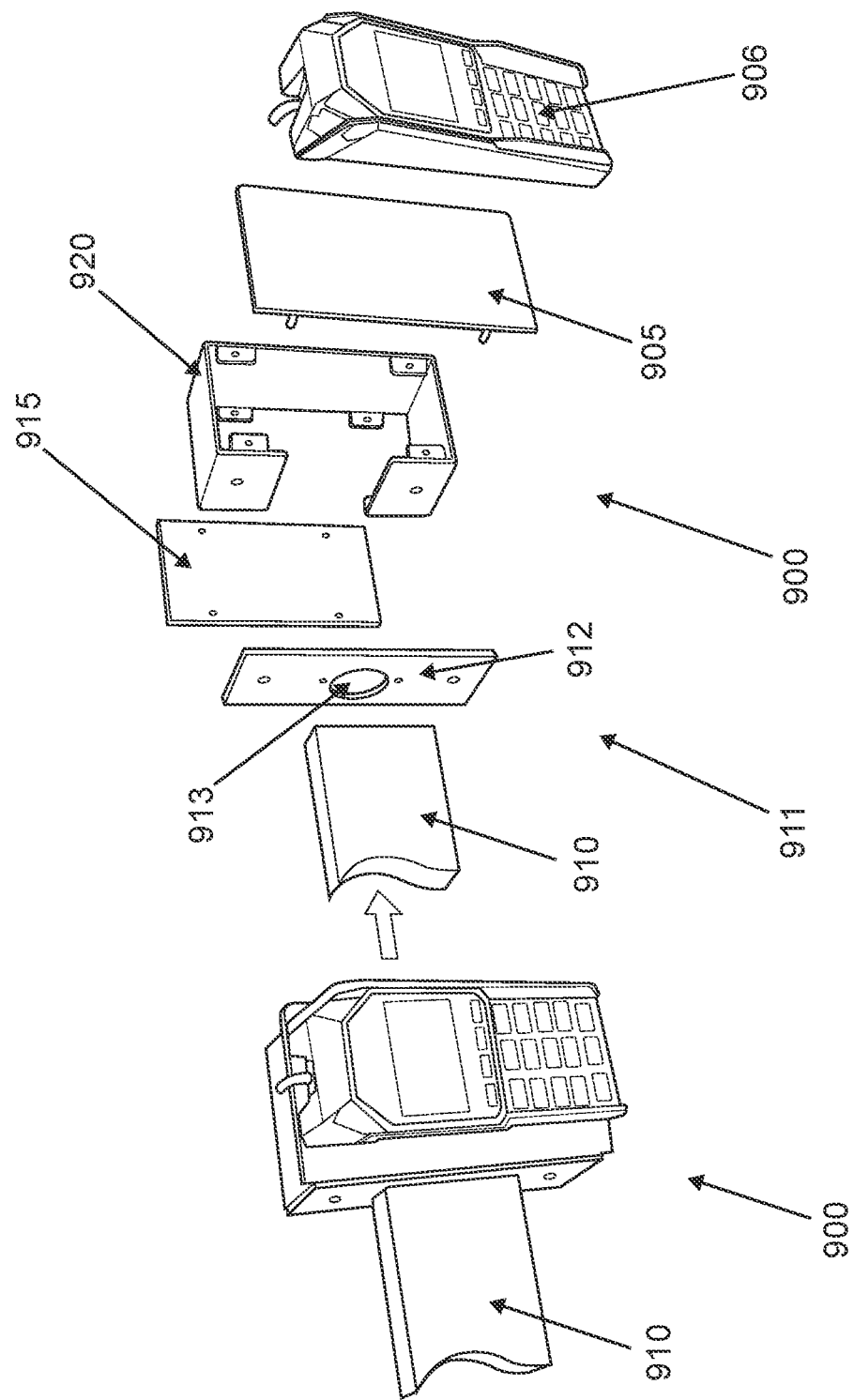
FIG. 9 is an illustration of an exploded view of one embodiment of a sidecar enclosure.

FIG. 9 is an illustration of an exploded view of one embodiment of a sidecar enclosure. As shown, sidecar enclosure 900 may preferably be removably attached to enclosure arm 910 and peripheral 906. As shown, the sidecar enclosure 900 may preferably comprise a customizable sidecar face plate 905, enclosure arm attachment plate 911, which may comprise cord hole 913 and enclosure arm attachment points 912, sidecar back plate 915, and a sidecar body 920. The enclosure arm attachment plate 911 may preferably be the connection point between the enclosure arm 910 and the sidecar body 920. The customizable sidecar face plate 905 and sidecar back plate 915 may preferably attach to the front and back of the sidecar body 920, creating an enclosed sidecar housing 925. The sidecar enclosure 900 may preferably have a zero-weld construction to make it more versatile, but in some embodiments, may include welding. In some embodiments, the customizable sidecar face plate 905 may preferably be customizable, such that a variety of kiosk devices may be attached to the customizable sidecar face plate 905, including, as shown, a the peripheral 906, which may be a credit card reader and pin-pad. Peripheral devices may include but not be limited to: EMV readers, 2-D scanners, cameras, signage, lighting, fingerprint stations, printers, retina scanners, barcode readers, or ticket readers.

Preferably, the sidecar enclosure has access holes to run any power or connection cables from the peripheral 906 to the core structure of the kiosk.

Figure 10:
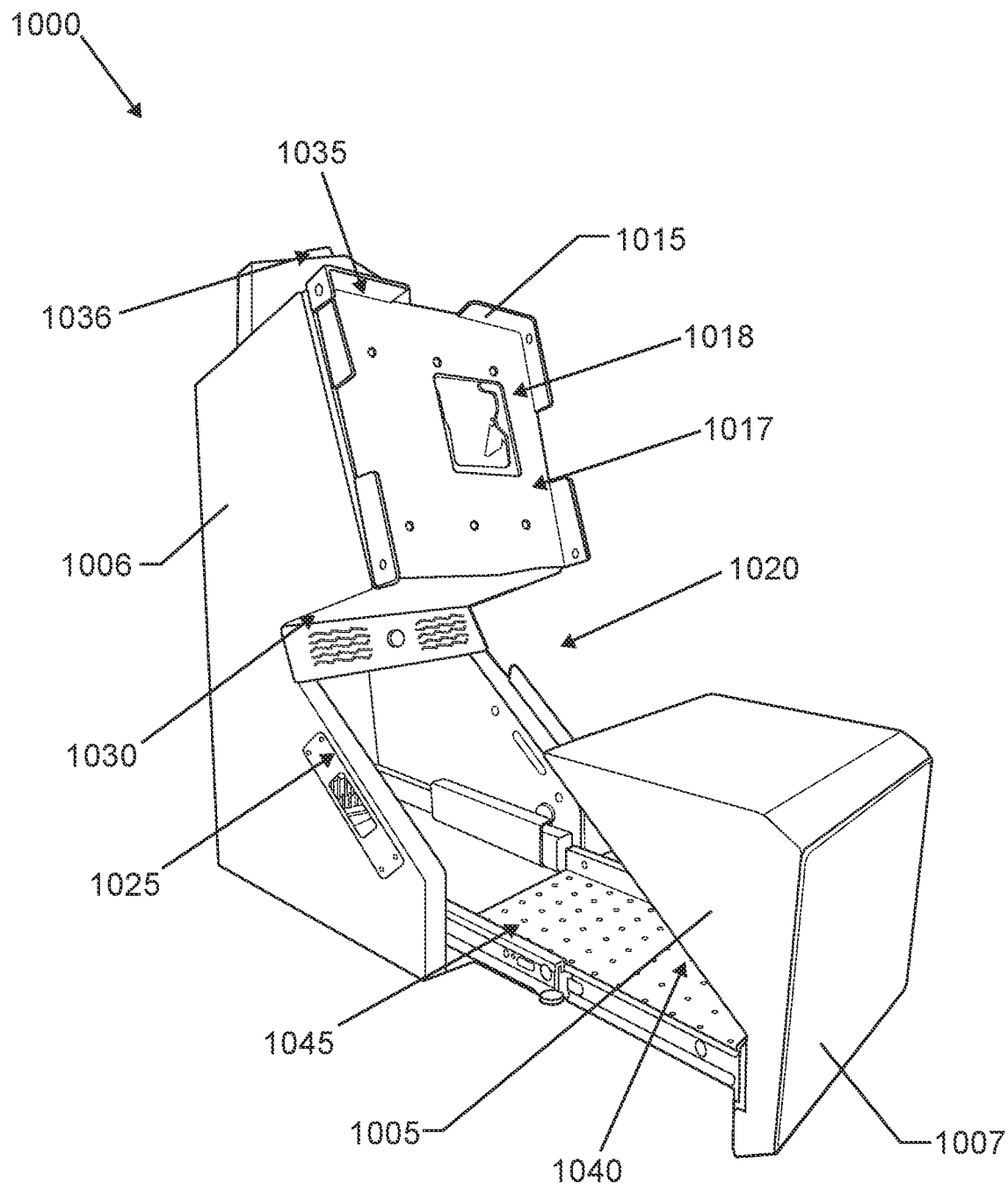
FIG. 10 is an illustration of a perspective view of one embodiment of a vertical drawer attached to the core structure of a kiosk.

FIG. 10 is an illustration of a perspective view of one embodiment of a drawer attached to the core structure of a kiosk. As shown, drawer 1005, which may have a vertical orientation, may be attached to the core structure 1006 of kiosk 1000. The core structure 1006 may preferably comprise or be removably connected to mounting plate 1015, which is configured to engage with a modular mount, an angular recess 1020, shoulder sidecar engagement cutouts 1025, and/or audio perforations 1030, which may allow venting or sound travel. The mounting plate 1015 may preferably be the point of connection between the core structure 1006 and the modular mount. The mounting plate 1015 may preferably be attached to the core structure 1006 by bolts or screws threaded through pre-drilled holes 1017. In some embodiments, the mounting plate 1015 may also include a cutout 1018 for cable management and pass through.

In the embodiment shown, the mounting plate 1015 may comprise a plate where the four corners have approximately 1-inch of a raised perimeter 1035. The raised perimeter 1035 may preferably extend approximately 6-inches from the corners of the mounting plate 1015. The raised perimeter 1035 may preferably contain holes 1036 which may serve as additional attachment points for the modular mount. In some embodiments, an angular recess 1020 may be configured below the mounting plate 1015 and the audio perforations 1030. The angular recess 1020 may serve as a docking area for the drawer 1005. The angular recess 1020 may preferably be angled inwards towards the body of the core structure 1006 at approximately 45 degrees, the angle may vary in other embodiments. The angular recess 1020 may preferably support several types of drawer arrangements, including angled and vertical.

In some embodiments, the drawer 1005 may consist of a vertical drawer profile 1007, but in other embodiments, the drawer 1005 may comprise an angled drawer profile, where the slope of the angled drawer profile 1010 may be similar to the angle formed by the angular recess 1020.

As shown, the drawer 1005 may comprise a perforated bottom 1040. The perforated bottom 1040 may preferably provide a multitude of anchor points for internal kiosk components and/or cable management. The drawer 1005 may comprise sliding drawer arms 1045, which may allow for quick and easy operation and allow for fast access to the interior of drawer 1005 components. The drawer arms 1045 may preferably be configured to allow the drawers to be interchangeable so that an angled drawer profile 1010 and a vertical drawer profile 1007 may easily be swapped out.

In some embodiments, the core structure 1006 may comprise shoulder sidecar cutouts 1025 that may be located on one or more sides of the core structure 1006 below the angular recess 1020. The shoulder sidecar cutouts 1025 may be attachment points, physical and/or electrical, for shoulder sidecars. The shoulder sidecar cutouts 1025 may preferably be covered with plates in embodiments without shoulder sidecars. Some embodiments may have shoulder sidecars on one or more sides of the core structure 1006. In other embodiments, there may be no shoulder sidecars. In some embodiments, audio perforations 1030 may be included below the mounting plate 1015 to support audio effects.

Figure 11:
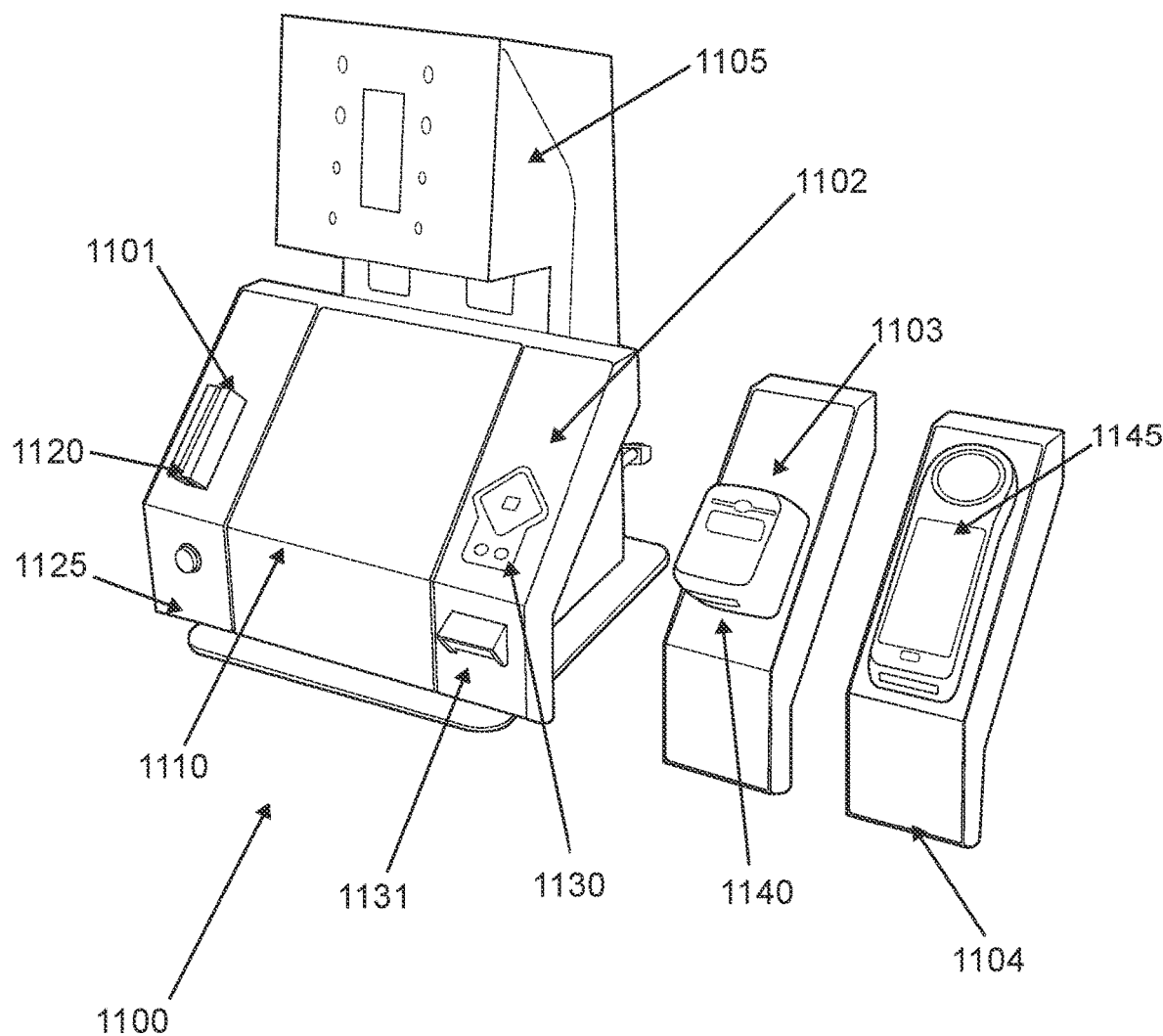
FIG. 11 is an illustration of a perspective view of one embodiment of a kiosk with various shoulder sidecars.

FIG. 11 is an illustration of a perspective view of one embodiment of a kiosk with various shoulder sidecars. As shown in FIG. 11, kiosk 1100 may have various interchangeable shoulder sidecars 1101, 1102, 1103, and 1104. FIG. 11 shows that kiosk 1100 may comprise a core structure 1105, an angular drawer profile 1110, and various shoulder sidecars 1101, 1102, 1103, 1104 attached to either side of the core structure 1105, but preferably flush with angular drawer profile 1110 to give the kiosk 1100 a clean and neat appearance. Shoulder sidecar 1101 may be equipped with a card swipe reader 1120 peripheral and a button 1125 peripheral. Shoulder sidecar 1102 may be equipped with a scanner 1130 and ticket/receipt dispenser/insert/output device 1131 peripheral. Shoulder sidecar 1103 may include a credit card scanner/processor 1140 peripheral. Shoulder sidecar 1104 may comprise a near field communication pad 1145. The disclosed shoulder sidecar embodiments are displayed for various kiosk device examples and are not limited to those shown on shoulder sidecars 1101, 1102, 1103, or 1104. Shoulder sidecars 1101, 1102, 1103, and 1104 may preferably be attached to the core structure by attaching to the cutout/attachment point shown in FIG. 10.

Figure 12:
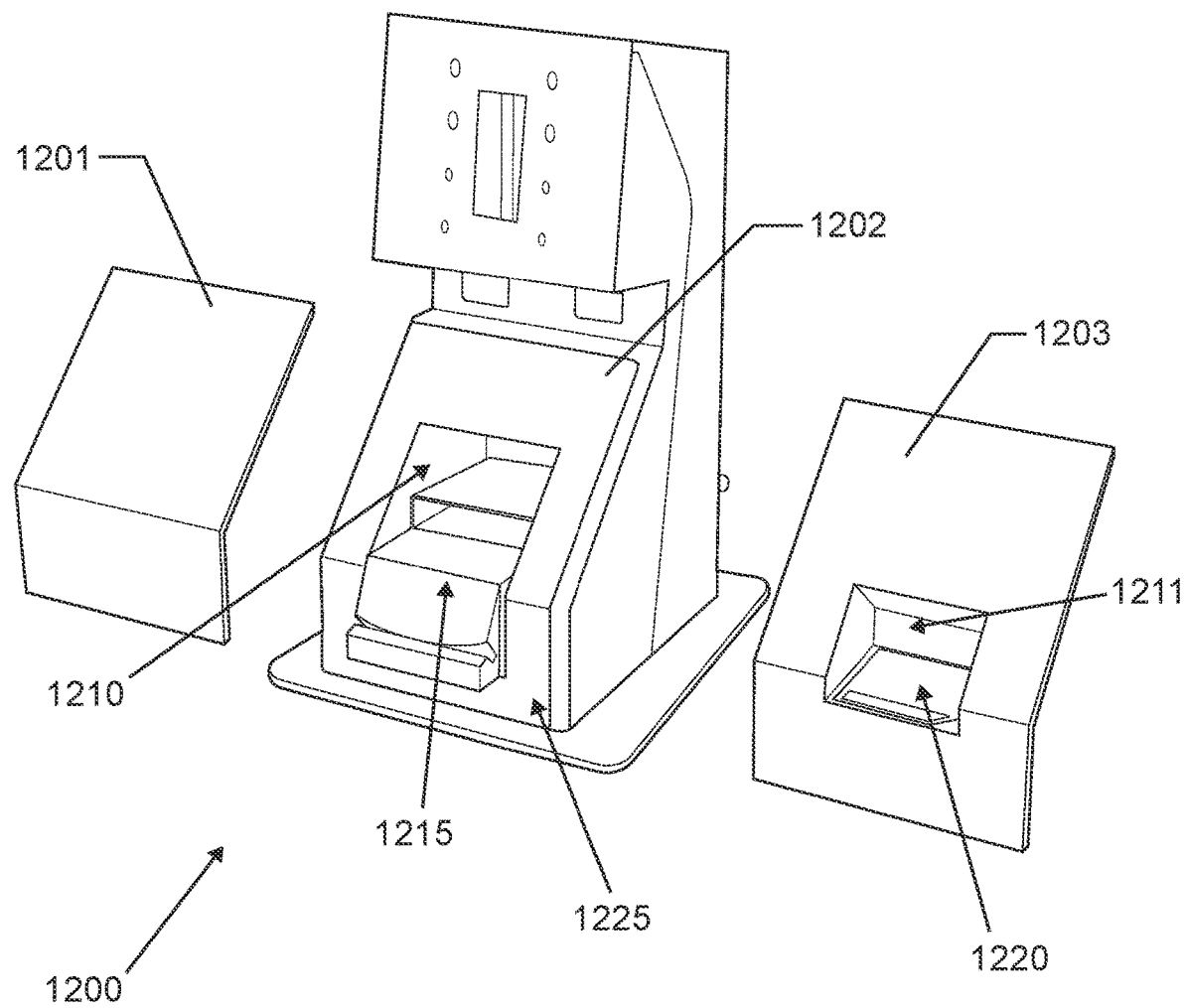
FIG. 12 is an illustration of a perspective view of one embodiment of a drawer with an angular profile and interchangeable peripheral panels.

FIG. 12 is an illustration of a perspective view of one embodiment of a drawer with an angular profile and interchangeable peripheral panels. As shown in FIG. 12, kiosk 1200 may be configured to have interchangeable peripheral panels 1201, 1202, and 1203 that may be connected to or integrated into the front of angular drawer profile 1225. Peripheral panel 1201 may be blank and provide a smooth surface that is not connected to a peripheral device. Peripheral panel 1202 may include a cutout 1210 for peripherals such as a printer 1215. Peripheral panel 1203 may have cutout 1211 for housing peripherals such as a biometric scanner 1220. Removable and interchangeable peripheral panels 1201, 1202, and 1203 and others like them allow for a large variation of kiosk customization with minimal effort in effecting the change and with minimal manufacturing costs relative to other custom designed kiosks.

Figure 13:
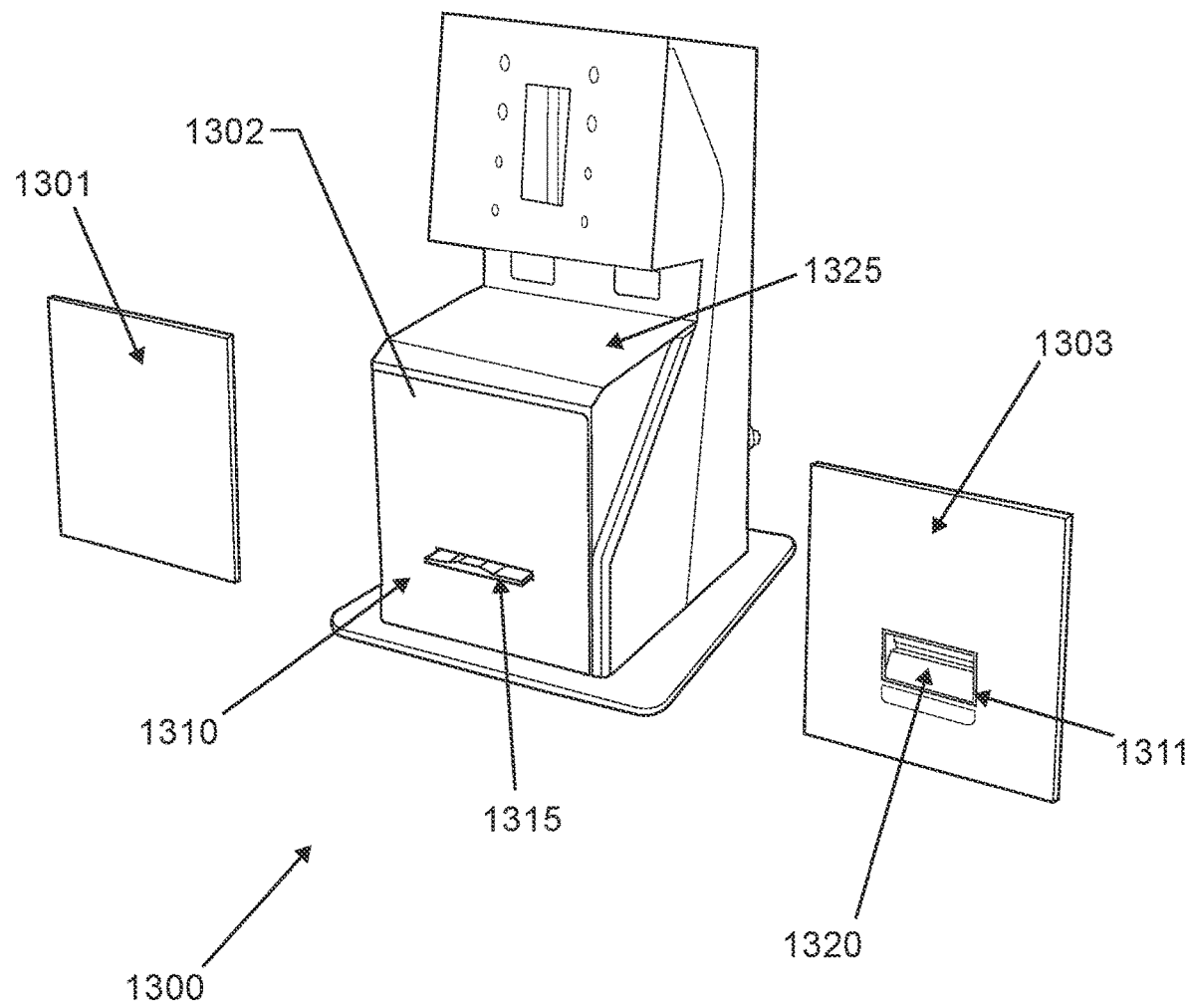
FIG. 13 is an illustration of a perspective view of one embodiment of a drawer with a vertical profile and interchangeable peripheral panels.

FIG. 13 is an illustration of a perspective view of one embodiment of a drawer with a vertical profile and interchangeable peripheral panels. As shown, kiosk 1300 may comprise interchangeable peripheral panels 1301, 1302, and 1303, for a vertical drawer profile 1325. Peripheral panel 1301 may be blank and provide a smooth surface. Peripheral panel 1302 may comprise a cutout 1310 for peripherals such as a ticket/paper dispenser 1315. Peripheral panel 1303 may comprise a cutout 1311 for other peripherals such as a printer tray 1320.

Figure 14:
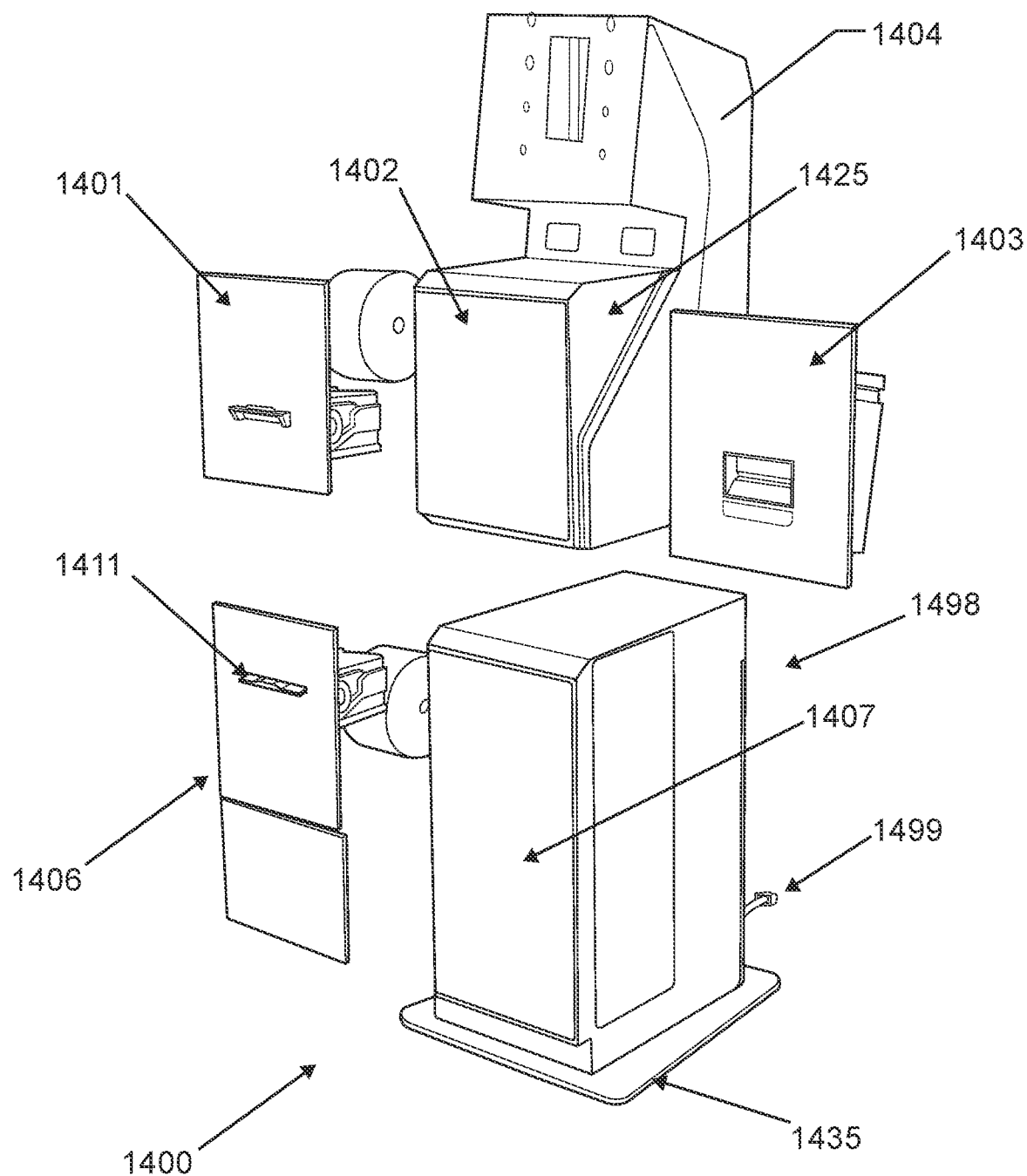
FIG. 14 is an illustration of one embodiment of a kiosk with a cabinet showing various interchangeable peripheral panels.

FIG. 14 is an illustration of one kiosk embodiment with a cabinet showing various interchangeable peripheral panels. As shown kiosk 1400 may comprise a core structure 1404, base plate 1435, vertical drawer profile 1425 that may engage with one of the peripheral panels 1401, 1402, and 1403, power cord 1499, cabinet 1498 that may engage with cabinet peripheral panels 1406 and 1407. Peripheral panel 1401 may incorporate a printer and ticket/paper dispenser. Peripheral panel 1403 may incorporate a printer tray. Cabinet peripheral panel 1406 may include a slot for a printer/paper/ticket discharge 1411. Cabinet peripheral panel 1407 may be a smooth surface panel.

Figure 15:
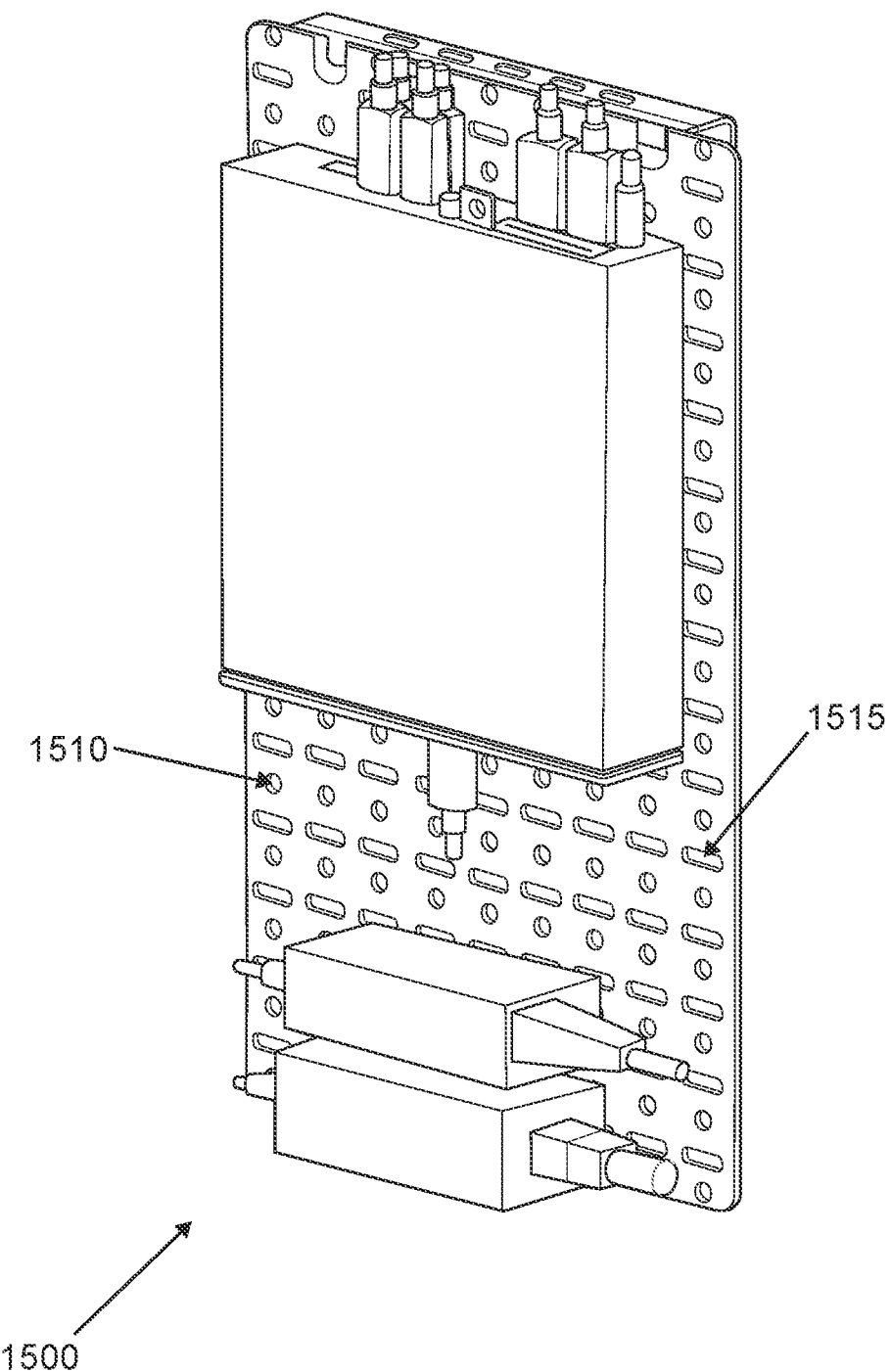
FIG. 15 is an illustration of a perspective view of one embodiment of an internal modular management plate.

FIG. 15 is an illustration of a perspective view of one embodiment of an internal modular management plate. Internal modular management plate 1500 may be substantially within the core structure, drawer, or cabinet portions of the kiosks. Internal modular management plates 1500 may preferably be used for cable management, internal component organization, battery storage, lighting, spare parts, power distribution, or for holding other equipment that might be required for kiosk function, maintenance, or support. Internal modular management plate 1500 may be a metal or strong plastic plate with machined holes 1510 and/or slots 1515 for component, peripheral, and/or for cable mounting and securing.

Various embodiments presented in terms of systems may comprise a number of components, modules, and the like. It is to be understood and appreciated that the various systems may include additional components, modules, etc., and/or may not include all of the components, modules, etc., discussed in connection with the figures as shown. A combination of these approaches may also be used.

The previous description of the disclosed embodiments is provided to enable any person of ordinary skill in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein, but is to be accorded the widest scope consistent with the principles and novel features disclosed herein.

It will be apparent to those of ordinary skill in the art that various modifications and variations may be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A modular kiosk, comprising:
   a core structure;
   a modular mount;
   one or more sidecar enclosures;
   one or more shoulder sidecars;
   a drawer;
   a cabinet;
   a riser;
   a base plate;
   one or more wheels; and
   one or more internal modular management plates;
   wherein said modular mount is configured to removably engage with a monitor;
   wherein said modular mount is removably attached to said core structure;
   wherein said drawer is removably attached to said core structure below said modular mount;
   wherein said one or more sidecar enclosures are removably attached to said modular mount;
   wherein each of said one or more sidecar enclosures is configured to engage with one or more peripherals;
   wherein said one or more shoulder sidecars are configured to be removably attached to said core structure, such that said one or more shoulder sidecars are substantially adjacent to said drawer;
   wherein each of said one or more shoulder sidecars is configured to engage with said one or more peripherals;
   wherein said monitor is removably attached to said modular mount;
   wherein said core structure comprises a mounting plate;
   wherein said modular mount is removably attached to said core structure at said mounting plate;
   wherein said core structure comprises an angular recess;
   wherein said drawer is configured to matingly engage with said angular recess;
   wherein said drawer is removably attached to said core structure at said angular recess by one or more drawer arms;

wherein said drawer has a vertical drawer profile;
wherein said drawer has an angular drawer profile;
wherein said drawer with said vertical drawer profile is configured to be interchangeable with a drawer with said angular drawer profile;
wherein said drawer with said angular drawer profile is configured to be interchangeable with a vertical drawer profile;
wherein said drawer is configured to engage with said one or more peripherals;
wherein said drawer has a perforated bottom;
wherein said modular mount comprises one or more enclosure arms; a cover plate; and a back cover plate;
wherein said one or more enclosure arms are configured to be adjustably connected to said back cover plate;
wherein said cover plate is configured to be removably attached to said monitor;
wherein at least one of said one or more enclosure arms is configured to extend beyond an edge of said back cover plate and such that at least one of said one or more sidecar enclosures is configured to extend to or beyond an edge of said monitor;
wherein at least one of said one or more enclosure arms comprises a channel; wherein said one or more enclosure arms comes in at least two different sizes;
wherein said one or more enclosure arms are interchangeable with each other;
wherein said core structure has one or more shoulder sidecar cutouts;
wherein said one or more shoulder sidecars are configured to be removably attached to said core structure at said one or more shoulder sidecar cutouts;
wherein said cabinet comprises at least one peripheral panel;
wherein said peripheral panel is configured to engage with said one or more peripherals;
wherein said one or more wheels are attached to said base plate; and
wherein one or more internal modular management plates are configured to be housed in one or more of said core structure, said drawer, and said cabinet.

* * * * *